(12) United States Patent
Hu et al.

(10) Patent No.: US 9,391,597 B2
(45) Date of Patent: Jul. 12, 2016

(54) BOOST CIRCUIT

(71) Applicant: Macronix International Co., Ltd., Hsinchu (TW)

(72) Inventors: Chih-Ting Hu, Tainan (TW); Shin-Jang Shen, Zhubei (TW); Yi-Ching Liu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 283 days.

(21) Appl. No.: 14/077,945

(22) Filed: Nov. 12, 2013

(65) Prior Publication Data

US 2015/0131344 A1     May 14, 2015

(51) Int. Cl.
*G05F 1/10* (2006.01)
*H03K 5/003* (2006.01)
*H03K 3/356* (2006.01)
*H02M 3/07* (2006.01)

(52) U.S. Cl.
CPC .......... *H03K 5/003* (2013.01); *H03K 3/356104* (2013.01); *H02M 3/07* (2013.01)

(58) Field of Classification Search
CPC ....................................................... G05F 1/10
See application file for complete search history.

(56) References Cited

U.S. PATENT DOCUMENTS

| | | | |
|---|---|---|---|
| 6,614,699 B2 | 9/2003 | Tanzawa | |
| 8,149,032 B2* | 4/2012 | Vlasenko | ................ H02M 1/34 327/157 |
| 2002/0196673 A1 | 12/2002 | Tanzawa | |

* cited by examiner

*Primary Examiner* — Hai L Nguyen
(74) *Attorney, Agent, or Firm* — Finnegan, Henderson, Farabow, Garrett & Dunner LLP

(57) ABSTRACT

A boost circuit includes a power rail to provide a supply voltage, a switch transistor controlling output of a boosted signal from a source of the switch transistor, and a timing and voltage control circuit configured to generate an equalization (EQ) signal to be applied to a gate of the switch transistor. The EQ waveform has a level being an EQ high level, an EQ low level lower than the EQ high level, or an EQ clamped level between the EQ low level and the EQ high level.

19 Claims, 7 Drawing Sheets

BOOST CIRCUIT

TECHNOLOGY FIELD

The disclosure relates to a boost circuit and, more particularly, to a boost circuit having a control circuit configured to prevent breakdown in the boost circuit and method for preventing breakdown in a boost circuit.

BACKGROUND

In a semiconductor circuit, a particular voltage value may sometimes need to be applied to a certain part of the semiconductor circuit, such as a specific substrate or a word line, so that the semiconductor circuit functions correctly. In some cases, the particular voltage is a relatively high voltage. Such a high voltage may be generated by a charge pump circuit, which pumps a relatively low input voltage up to a relatively high output voltage. Generally, a charge pump circuit needs to work with a clock signal having a higher voltage level than a clock signal normally employed for other parts of the semiconductor circuit. For example, if a supply voltage $V_{DD}$ on a power rail of a semiconductor circuit is about 1.8 V, the voltage level of a clock signal in the semiconductor circuit is also about 1.8 V. In order for the charge pump circuit to generate a voltage higher than the supply voltage $V_{DD}$, a high-voltage clock signal having a voltage level of about double the supply voltage $V_{DD}$, i.e., about 3.6 V, is needed.

A boost circuit may be used to "boost" the voltage of an input clock signal and generate an output high-voltage clock signal, i.e., a boosted clock signal, having a voltage level of about double the supply voltage $V_{DD}$. A boost circuit may comprise multiple semiconductor devices, including field-effect transistors (FET's) such as metal-oxide-semiconductor FET's (MOSFET's). When the voltage of the input clock signal is boosted higher than $V_{DD}$, that boosted high voltage of about double the supply voltage $V_{DD}$ may also be applied to one or more of the FET's.

Sometimes, a semiconductor circuit may need to switch between a low $V_{DD}$ condition and a high $V_{DD}$ condition, e.g., between an operation condition where $V_{DD}$ is about 1.8 V and an operation condition where $V_{oo}$ is about 3.3 V. During operation when $V_{DD}$ is about 3.3 V, the boosted clock signal is about 6.6 V, which may be higher than the breakdown voltage of one or more of the FET's in the boost circuit, potentially causing one or more of the FETs to break down.

SUMMARY

In accordance with the disclosure, there is provided a boost circuit. The boost circuit includes a power rail to provide a supply voltage, a switch transistor controlling output of a boosted signal from a source of the switch transistor, and a timing and voltage control circuit configured to generate an equalization (EQ) signal to be applied to a gate of the switch transistor. The EQ signal has a level being an EQ high level, an EQ low level lower than the EQ high level, or an EQ clamped level between the EQ low level and the EQ high level.

Also in accordance with the disclosure, there is provided a method for controlling output of a boosted signal. The method includes generating an EQ signal having a level being one of an EQ high level, an EQ low level lower than the EQ high level, and an EQ clamped level between the EQ low level and the EQ high level. The method further includes applying the EQ signal to a gate of a switch transistor controlling an output of the boosted signal.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include boost circuits that are capable of sustaining high output voltage and methods for preventing a boost circuit from breakdown.

Hereinafter, embodiments consistent with the disclosure will be described with reference to the drawings. Wherever possible, the same reference numbers will be used throughout the drawings to refer to the same or like parts.

Figure 1:
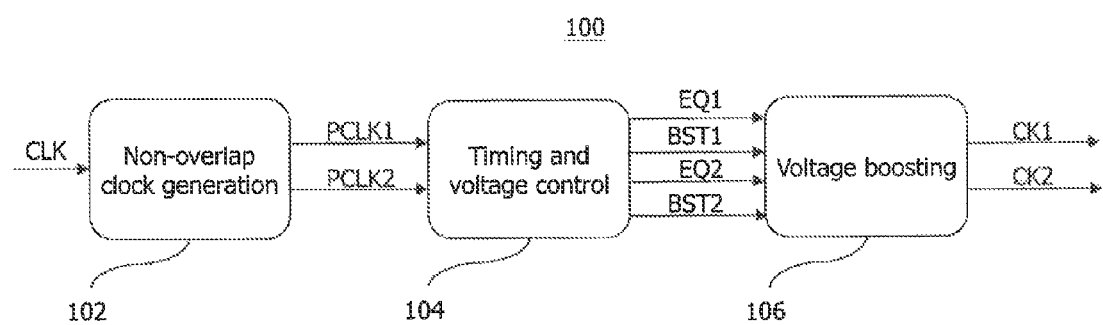
FIG. 1 is a diagram schematically showing a boost circuit according to exemplary embodiments.

FIG. 1 schematically shows an exemplary boost circuit 100 consistent with embodiments of the disclosure to generate a boosted clock signal having a boosted high clock level higher than a high clock level of an input clock signal (for example, about twice the high clock level of the input clock signal), where the high clock level of the input clock signal is about the same as a supply voltage $V_{DD}$. In some embodiments, the exemplary boost circuit 100 generates two boosted clock signals CK1 and CK2, as indicated in FIG. 1.

Consistent with embodiments of the disclosure, the boost circuit 100 is configured to operate under both a low $V_{DD}$ operation condition and a high $V_{DD}$ operation condition, and to switch between the two operating conditions. As used in this disclosure, the low $V_{DD}$ refers to a $V_{DD}$ that does not cause the boosted high clock level of the boosted clock signal to be higher than breakdown voltages of electronic components in the boost circuit 100, and the high $V_{DD}$ refers to a $V_{DD}$ that may cause the boosted high clock level of the boosted clock signal to be higher than the breakdown voltages of electronic components in the boost circuit 100. For example, a low $V_{DD}$ may be about 1.65 V to about 2 V, and a high $V_{DD}$ may be about 2.7 V to about 3.6 V. In some embodiments, a low $V_{DD}$ may be about 1.8 V, and a high $V_{DD}$ may be about 3.3 V.

Referring to FIG. 1, the boost circuit 100 includes a non-overlap clock generating section 102, a timing and voltage control section 104, and a voltage boosting section 106. The non-overlap clock generating section 102 is configured to generate a first clock signal PCLK1 and a second clock signal PCLK2 based on an input clock signal CLK.

Figure 2:
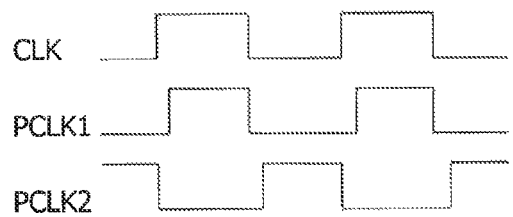
FIG. 2 is a graph schematically showing waveforms of CLK, PCLK1, and PCLK2 according to exemplary embodiments.

FIG. 2 schematically shows exemplary waveforms of CLK, PCLK1, and PCLK2. Consistent with embodiments of the disclosure, each of CLK, PCLK1, and PCLK2 has a level being a high level equal to about $V_{DD}$ or a low level equal to about a ground voltage, i.e., 0 V, with a period of, e.g., 40 ns. Hereinafter, unless otherwise specified, the high level of a waveform is ideally considered to be about $V_{DD}$, but may be lower than $V_{DD}$ by an amount attributable to, for example, parasitic resistance. Also, the low level of a waveform is considered to be about 0 V, but may be higher than 0 V by an amount attributable to, for example, parasitic resistance. The differences between the high level and $V_{DD}$ and between the low level and 0V are small since they result from, for example, voltage drop in the parasitic capacitance. As shown in FIG. 2, PCLK1 and PCLK2 do not overlap with each other, that is, PCLK1 and PCLK2 do not become high at the same time. In particular, within one period, PCLK1 rises from the low level to the high level at a time delay after CLK rises from the low level to the high level, and falls from the high level to the low level at about the same time when CLK falls from the high level to the low level. Similarly, PCLK2 rises from the low level to the high level at a time delay after CLK falls from the high level to the low level, and falls from the high level to the low level at about the same time when CLK rises from the low level to the high level. Hereinafter, a transition of a waveform from one level to another level is also referred to as an edge of the waveform. In particular, a transition of a waveform from a low level to a high level is also referred to as a rising edge of the waveform, and a transition of the waveform from the high level to the low level is also referred to as a falling edge.

Referring again to FIG. 1, the first and second clock signals PCLK1 and PCLK2 are input to the timing and voltage control section 104, which generates a first boost source waveform BST1 and a second boost source waveform BST2 to be boosted by the voltage boosting section 106. BST1 and BST2 also participate in controlling the operation of the voltage boosting section 106. The timing and voltage control section 104 further generates a first equalization (EQ) waveform EQ1 and a second EQ waveform EQ2 that are also used in controlling the operation of the voltage boosting section 106. In particular, as will be discussed later in this disclosure, each of EQ1 and EQ2 is used to control the on and off operations of a switch component, such as a switch transistor, that outputs the boosted clock signal.

Figure 3:
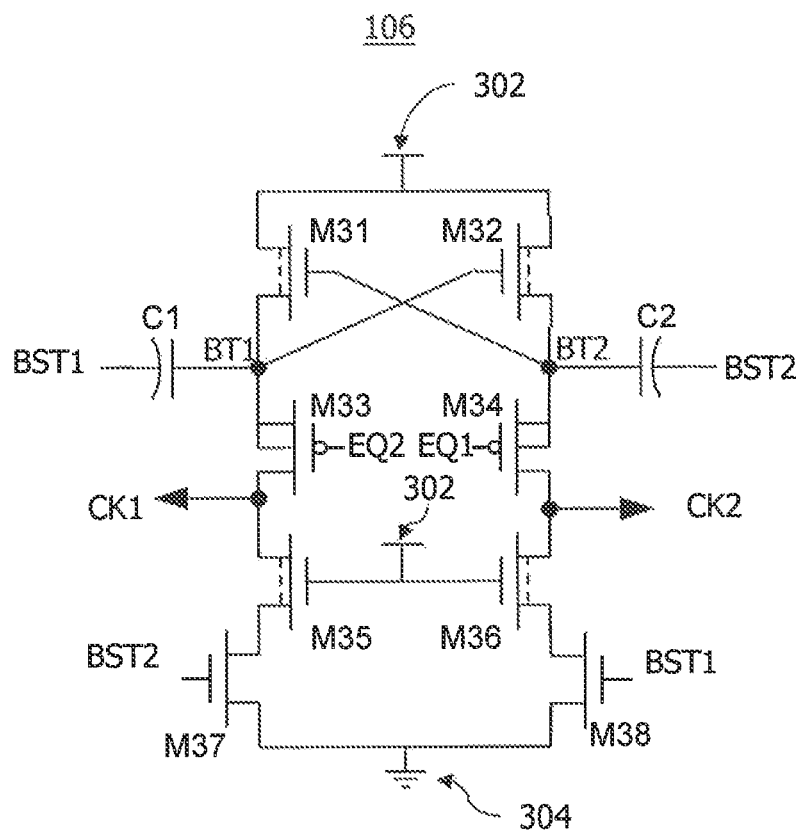
FIG. 3 is a circuit diagram schematically showing a voltage boosting section of the boost circuit according to exemplary embodiments.

FIG. 3 schematically shows an exemplary voltage boosting section 106 consistent with embodiments of the disclosure. The exemplary voltage boosting section 106 shown in FIG. 3 has a "mirror" structure, i.e., a symmetric structure, including transistors M31-M38 and capacitors C1 and C2. Transistors M31-M38 are metal-oxide-semiconductor field-effect-transistors (MOSFET's), among which M31, M32, M35, M36, M37, and M38 are n-channel MOSFET's (n-MOS's) and M33 and M34 are p-channel MOSFET's (p-MOS's). As will be seen from FIG. 3 and discussion later in this disclosure, even during a high $V_{DD}$ operation, a voltage difference applied across a gate and a source/drain of each of transistors M31, M32, M35, and M36 is relatively low and does not exceed the oxide breakdown voltage, i.e., the voltage at which the gate oxide is broken down, of that transistor. Hereinafter, unless otherwise specified, an oxide breakdown voltage of a transistor is also referred to as a breakdown voltage of the transistor. Therefore, for transistors M31, M32, M35, and M36, thin-oxide n-MOS's, which have lower threshold voltages, may be used to reduce power consumption and charge sharing time.

Figure 4:
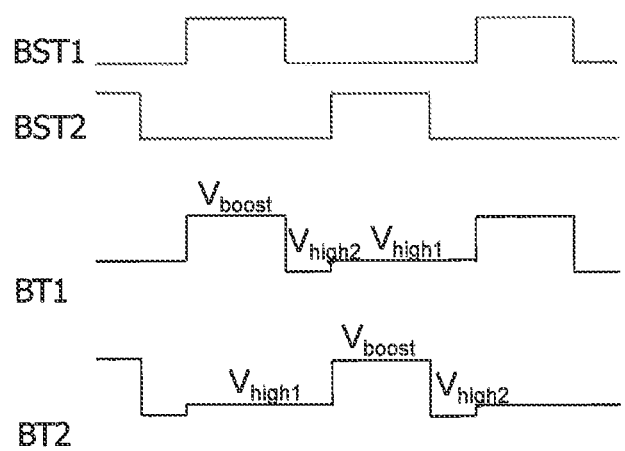
FIG. 4 is a graph schematically showing waveforms of BST1, BST2, BT1, and BT2 according to exemplary embodiments.

As shown in FIG. 3, drains of transistors M31 and M32 are connected to a power rail 302, which provides the supply voltage $V_{DD}$. Transistors M31 and M32 form a charge path that together with the capacitors C1 and C2 generate boosted waveforms BT1 and BT2, using BST1 and BST2 as input. FIG. 4 schematically shows exemplary waveforms of BST1, BST2, BT1, and BT2. The generation of BST1 and BST2 are further discussed later in this disclosure. It is seen from FIG. 4 that, when BST2 rises from the low level to the high level, BT1 is charged to a first high level $V_{high1}$ by the power rail 302 and remains at that voltage level until BST1 rises from the low level to the high level, at which time BT1 is boosted from $V_{high1}$ to a boosted high level $V_{boost}$, which may be about 1.8 times—about twice of $V_{DD}$. Ideally, $V_{high1}$ would be the same as $V_{DD}$. However, due to the parasitic resistances and capacitances of electronic components in boost circuit 100, $V_{high1}$ is lower than $V_{DD}$, as explained above. When BST1 falls from the high level to the low level, BT1 falls from the boosted high level $V_{boost}$ to a second high level $V_{high2}$. Similarly, because of the parasitic resistances and capacitances, $V_{high2}$ is higher than the ground level but lower than $V_{DD}$ and $V_{high1}$. The change of BT2 over time is similar to that of BT1 but with a different phase, and thus is not described in detail here.

Referring again to FIG. 3, sources of transistors M37 and M38 are connected to a ground 304, drains of transistors M37 and M38 are connected to sources of transistors M35 and M36, and gates of transistors M37 and M38 are controlled by BST2 and BST1, respectively. Moreover, gates of transistors M35 and M36 are connected to the power rail 302. Therefore, transistors M35 and M36 are always turned on during operation of the boost circuit 100. Transistors M35, M36, M37, and M38 form a discharge path. The discharge path is configured to pull the boosted clock signal CK1 to the low level when BST2 rises to the high level to turn on transistor M37. Similarly, the discharge path is also configured to pull the boosted clock signal CK2 to the low level when BST1 rises to the high level to turn on the transistor M38. Transistors M35 and M36 are inserted in the discharge path to respectively prevent the occurrence of large peak discharge current and prevent transistors M37 and M38 from breakdown.

Transistors M33 and M34 serve as charge sharing switch components that control the output of the boosted clock signals CK1 and CK2, respectively. That is, the transistors M33 and M34 are the switch transistors in the voltage boosting section 106. For example, as shown in FIG. 3, the transistor M33 receives BT1 at its drain, and outputs CK1 at its source when EQ2 is at a level that turns on transistor M33. Similarly, the transistor M34 receives BT2 at its drain, and outputs CK2 at its source when EQ1 is at a level that turns on transistor M34. Exemplary waveforms of EQ1, EQ2, CK1, and CK2 will be described later in this disclosure.

Figure 5:
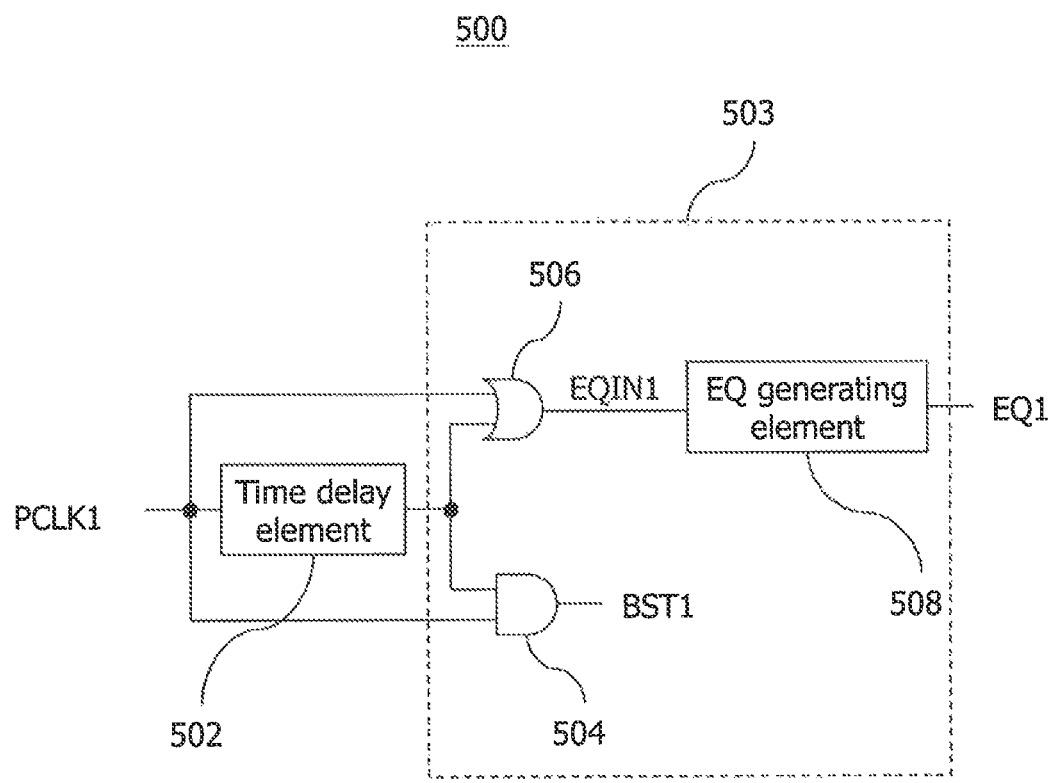
FIG. 5 is a diagram schematically showing one segment of a timing and voltage control section of the boost circuit according to exemplary embodiments.

As described above, BST1, BST2, EQ1, and EQ2 are generated by the timing and voltage control section 104. Consistent with embodiments of the disclosure, the timing and voltage control section 104 includes two nearly identical segments. One of the two segments is configured to generate BST1 and EQ1, and the other one is configured to generate BST2 and EQ2. As an example, FIG. 5 schematically shows one exemplary segment 500 of the timing and voltage control section 104 that is configured to generate BST1 and EQ1. The other segment of the timing and voltage control section 104 that is configured to generate BST2 and EQ2 is similar to the segment 500 and thus is not depicted here.

As shown in FIG. 5, the segment 500 includes a time delay element 502 configured to generate a delayed signal based on an input signal. For example, the time delay element 502 delays PCLK1 to generate a delayed PCLK1. That is, an output, i.e., delayed PCLK1, of the time delay element 502 has a waveform similar to that of PCLK1, but is delayed in time by, e.g., about 2 ns. Both PCLK1 and delayed PCLK1 are input to a logic circuit 503 to generate BST1 and EQ1. In some embodiments, as shown in FIG. 5, the logic circuit 503 includes an AND gate 504, an OR gate 506, and an EQ generating element 508. Specifically, delayed PCLK1 is input to the AND gate 504 together with PCLK1 to generate BST1. Similarly, delayed PCLK1 is also input to the OR gate 506 together with PCLK1 to generate an EQ input waveform EQIN1, which is then input to the EQ generating element 508 for generating EQ1.

Figure 6:
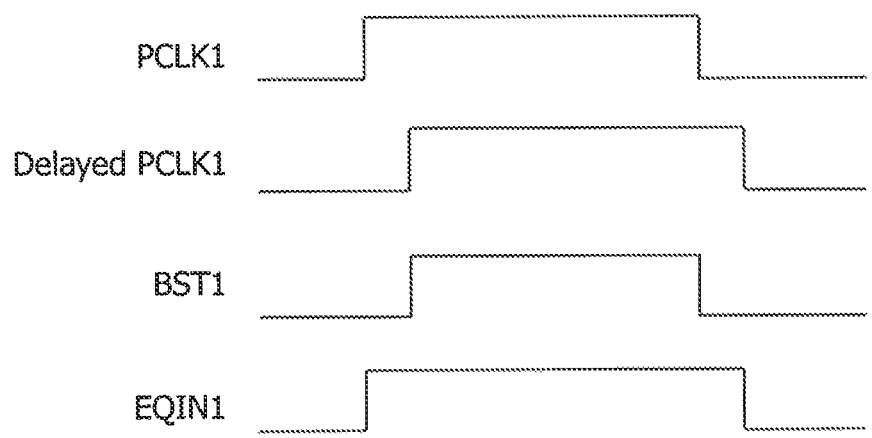
FIG. 6 is a graph schematically showing waveforms of PCLK1, delayed PCLK1, BST1, and EQIN1 according to exemplary embodiments.

FIG. 6 schematically shows exemplary waveforms of PCLK1, delayed PCLK1, BST1, and EQIN1, each of which transitions between a high level and a low level. It is seen from FIG. 6 that, within one period, the rising edge of BST1 coincides with the rising edge of delayed PCLK1. That is, BST1 rises from a low level to a high level at about the same time when delayed PCLK1 rises from a low level to a high level. The falling edge of BST1 coincides with the falling edge of PCLK1. That is, BST1 falls from the high level to the low level at about the same time when PCLK1 falls from a high level to a low level. Further, the rising edge of EQIN1 coincides with the rising edge of PCLK1 and the falling edge of EQIN1 coincides with the falling edge of delayed PCLK1. That is, EQIN1 rises before BST1 rises and falls after BST1 falls. It is noted that due to system delay, two edges coinciding with each other does not mean they rise or fall at exactly the same time. For example, the rising edge of BST1 may rise slightly behind the rising edge of delayed PCLK1. Such delay is usually smaller than the intentional delay created by the time delay element 502.

Figure 7:
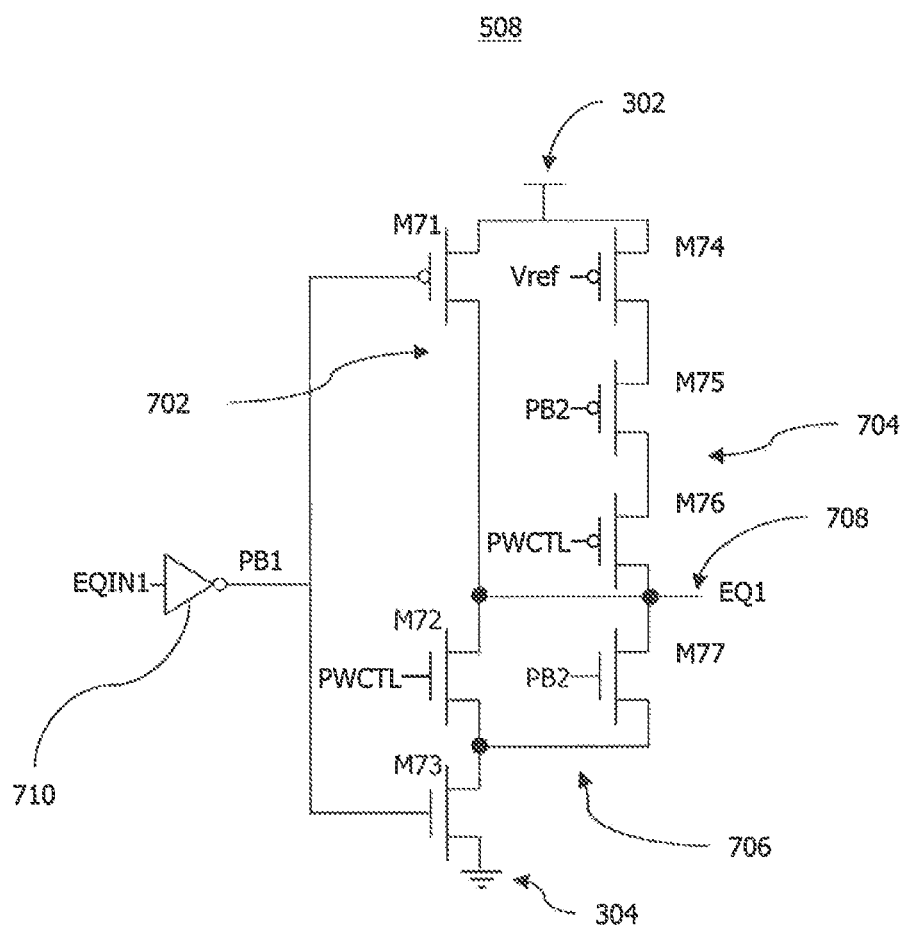
FIG. 7 is a circuit diagram schematically showing an EQ generating element of the timing and voltage control section according to exemplary embodiments.

FIG. 7 schematically shows an exemplary EQ generating element 508 consistent with embodiments of the disclosure, as an example of the EQ generating element 508. The EQ generating element 508 includes a first circuit branch 702, a second circuit branch 704, and a third circuit branch 706, configured to generate different portions of a waveform of EQ1, which is output from an EQ output terminal 708. As shown in FIG. 7, the first circuit branch 702 and the second circuit branch 704 are connected between the power rail 302 and the EQ output terminal 708, and the third circuit branch 706 is connected between the ground 304 and the EQ output terminal 708.

In the example shown in FIG. 7, the EQ generating element 508 includes an inverter 710 and transistors M71-M77 controlled by different signals. In FIG. 7, transistors M71, M74, M75, and M76 are p-MOS's, while transistors M72, M73, and M77 are n-MOS's. The first circuit branch 702 includes M71. The second circuit branch 704 includes M74, M75, and M76. The third circuit branch 706 includes M72, M73, and M77.

Consistent with embodiments of the disclosure, the EQ generating element 508 is configured to work under both the low $V_{DD}$ operation condition, e.g., about 1.65 V to about 2 V, and the high $V_{DD}$ operation condition, (e.g., about 2.7 V to about 3.6 V. In the example shown in FIG. 7, transistors M72 and M76 are controlled by a power control signal PWCTL, which keeps M72 turned on and M76 turned off during the operation under the low $V_{DD}$ operation condition, and keeps M72 turned off and M76 turned on during the operation under the high $V_{DD}$ operation condition. That is, when the EQ generating element 508 is working under the low $V_{DD}$ operation condition, the second circuit branch 704 is cut off and thus does not contribute to the generation of EQ1. When the EQ generating element 508 is working under the high $V_{DD}$ operation condition, the second circuit branch 704 kicks in and contributes to the generation of EQ1.

Figure 8A:
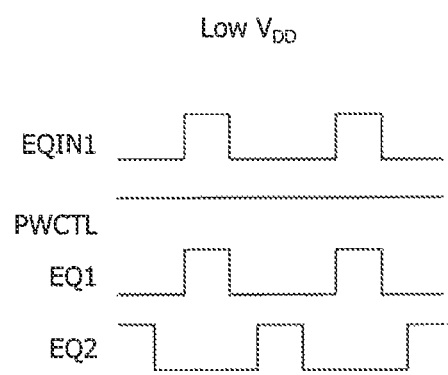
FIGS. 8A and 8B are graphs schematically showing waveforms of EQIN1, PWCTL, EQ1, and EQ2 during a low $V_{DD}$ operation and waveforms of EQIN1, PB2, PWCTL, EQ1, and EQ2 during a high $V_{DD}$ operation according to exemplary embodiments.

FIG. 8A schematically shows exemplary waveforms of EQIN1, PWCTL, and EQ1 when the exemplary EQ generating element 508 shown in FIG. 7 is operating under the low $V_{DD}$ operation condition. Although FIG. 8A does not show the waveform of PB1, i.e., the output of the inverter 710, one of ordinary skill in the art will now recognize that PB1 is merely the inverse of EQIN1. In this example, PWCTL is set to the high level to keep M72 turned on and M76 turned off. As shown in FIG. 8A, under the low $V_{DD}$ operation condition, EQ1 has a level being an EQ high level or an EQ low level, which coincide with the high and low levels of EQIN1. Consistent with embodiments of the disclosure, the EQ high level equals about $V_{DD}$ and the EQ low level equals about 0 V.

Figure 8B:
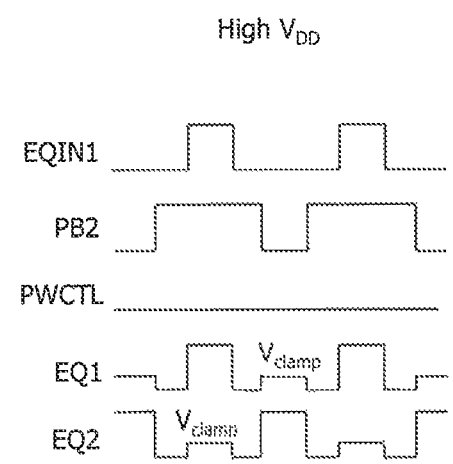

When the EQ generating element 508 is operating under the high $V_{DD}$ operation condition, PWCTL is set to the low level, as shown in FIG. 8B, to keep M72 turned off and M76 turned on. Consistent with embodiments of the disclosure, transistor M74 in the second circuit branch 704 is controlled by a reference voltage $V_{ref}$, which keeps transistor M74 in a partially turned on status. As a consequence, there is a voltage drop $V_{share}$, such as, for example, about 2 V, across the drain and source of transistor M74. Therefore, when transistor M75 is turned on, the voltage applied to the EQ output terminal is not a voltage of about $V_{DD}$, but a voltage about $V_{DD}-V_{share}$. That is, transistor M74, controlled by the reference voltage $V_{ref}$ serves as a voltage clamping element that clamps the voltage output by the EQ output terminal at an EQ clamped level $V_{clamp}$, equal to about $V_{DD}-V_{share}$.

In some embodiments, other electronic components may be used as the voltage clamping element instead of the $V_{ref}$-controlled transistor M74. For example, an FET coupled to a diode or a decouple capacitor may be used as the voltage clamping element. Using an FET coupled to a diode may reduce a footprint of the boost circuit 100, because there is no need for a circuit to generate the reference voltage $V_{ref}$.

As discussed above, during the high $V_{DD}$ operation, PWCTL is set to the low level so that transistor M72 is turned off during this operation. This is equivalent to a situation in which the third circuit branch 706 does not include transistor M72 but just transistors M73 and M77. It is seen from FIG. 7 that transistor M77 in the third circuit branch 706 and transistor M75 in the second circuit branch 704 are both controlled by a same waveform PB2, i.e., the inverse of EQIN2. Since transistors M75 and M77 have opposite types—one being a p-MOS and the other one being an n-MOS in the example shown in FIG. 7, they are turned on and off in turn. That is, when M75 is turned on, M77 is turned off, and vice versa. Similarly, transistors M71 and M73 also have opposite types and are controlled by a same waveform PB1, i.e., the inverse of EQIN1, and thus are turned on and off in turn. That is, when M71 is turned on, M73 is turned off, and vice versa. Such a scheme ensures that during the high $V_{DD}$ operation, the first, second, and third circuit branches 702, 704, and 706 output to the EQ output terminal 708 in turn to generate EQ1 having a level being the EQ high level (about $V_{DD}$), the EQ clamped level (about $V_{DD}-V_{share}$), or the EQ low level (about 0 V).

FIG. 8B schematically shows exemplary waveforms of EQIN1, PB2, PWCTL, and EQ1 when the exemplary EQ generating element 508 shown in FIG. 7 is working under the high $V_{DD}$ operation condition. Consistent with embodiments of the disclosure, PB2 is a waveform similar to PB1 but generated by the other segment of the timing and voltage control section 104. That is, PB2 is essentially the inverse of EQIN2. As a comparison, FIGS. 8A and 8B also show the waveform of EQ2 during the low $V_{DD}$ operation and the high $V_{DD}$ operation, respectively.

Figure 9A:
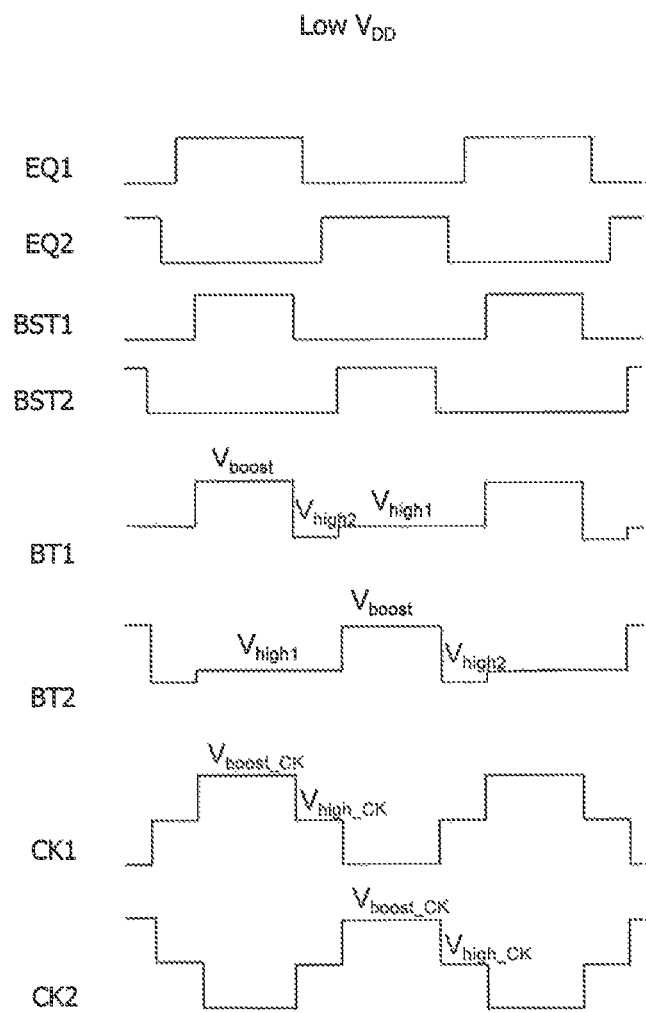
FIGS. 9A and 9B are graphs schematically showing waveforms of EQ1, EQ2, BST1, BST2, BT1, BT2, CK1, and CK2 during the low and high $V_{DD}$ operations, respectively, according to exemplary embodiments.
Figure 9B:
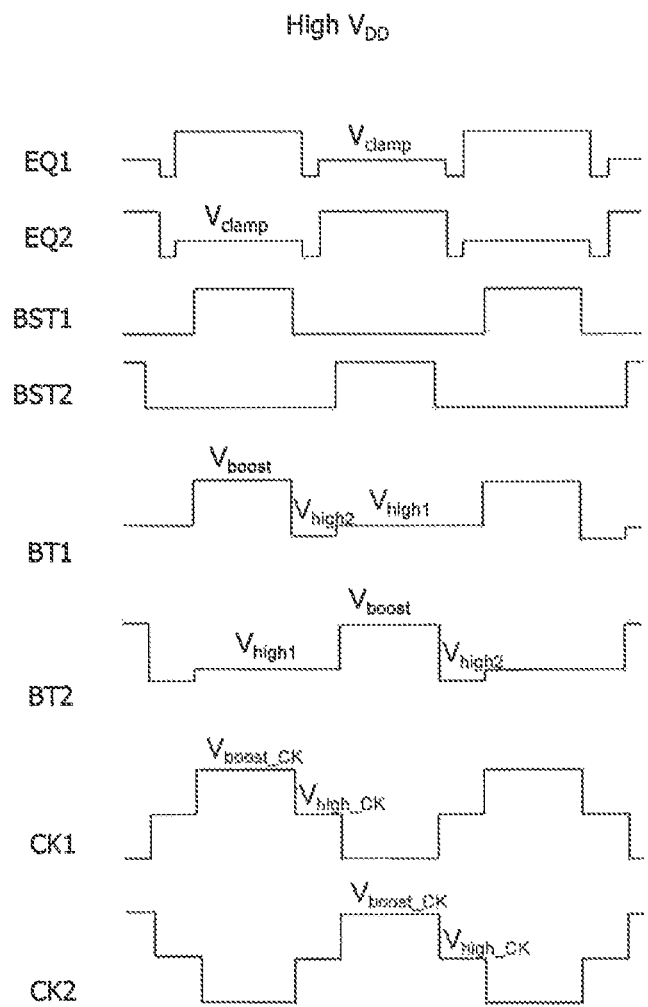

The waveforms discussed above, i.e., BST1, BST2, EQ1, and EQ2, are input to the voltage boosting section 106 as shown in, e.g., FIG. 3 for generating the boosted clock signals CK1 and CK2. FIGS. 9A and 9B schematically show exemplary waveforms of EQ1, EQ2, BST1, BST2, BT1, BT2, CK1, and CK2 during the low $V_{DD}$ and the high $V_{DD}$ operations, respectively. When BT1 is at the boosted high level $V_{boost}$, CK1 is also at the boosted high clock level, $V_{boost\_CK}$, which approximately equals $V_{boost}$. In practice, the boosted high clock level at CK1, $V_{boost\_CK}$, may be lower than the boosted high level at BT1, $V_{boost}$, due to, for example, the parasitic resistance and capacitance of M33. Similarly, when BT2 is at the boosted high level $V_{boost}$, CK2 is also at the boosted high clock level, $V_{boost\_CK}$, which approximately equals $V_{boost}$. In practice, the boosted high clock level at CK2, $V_{boost\_CK}$, may be lower than the boosted high level at BT2, $V_{boost}$, due to, for example, the parasitic resistance and capacitance of M34.

It is seen from FIG. 9B that, during the high $V_{DD}$ operation, the time period within which EQ2 is at the EQ clamped level, $V_{clamp}$, encompasses the time period within which CK1 is at the boosted high clock level, $V_{boost\_CK}$. Similarly, the time period within which EQ1 is at the EQ clamped level, $V_{clamp}$, encompasses the time period within which CK2 is at the boosted high clock level, $V_{boost\_CK}$. That is, whenever an output boosted signal is at a boosted high clock level that possibly could cause the switch component, i.e., a switch transistor in the example shown in FIG. 3, to break down, a voltage equal to $V_{clamp}$ is applied to the gate of the switch transistor, which reduces the voltage drop between the gate and the source of the switch transistor, preventing the switch transistor from breaking down. Consistent with embodiments of the disclosure, $V_{clamp}$ may be controlled by controlling the voltage drop $V_{share}$ across a voltage clamping element, such as transistor M74 shown in FIG. 7. The voltage drop $V_{share}$ across transistor M74 may be controlled by controlling the reference voltage $V_{ref}$.

For the purpose of simplifying illustration, each edge of each waveform shown in the figures of this disclosure is depicted as a straight vertical line. It is to be noted that, due to delays caused by, e.g., parasitic RC circuits, gate delay, or clock counter controlled delay, the edges may not be straight vertical lines but may be bent, curved, or inclined lines. Moreover, in the present disclosure, the voltage boosting section 106 is assumed to be symmetric, and thus the outputs from the left half and the right half of the voltage boosting section 106 are similar to each other except for their respective phases. For example, as shown in, e.g., FIGS. 9A and 9B, the waveforms of BT1 and BT2 are identical to each other except for their respective phases, and the waveforms of CK1 and CK2 are identical to each other except for their respective phases. It is noted, however, in practice, due to the differences between the nominally-identical electronic components in the boost circuit 100, the outputs from the left half and the right half of the voltage boosting section 106 may be different from each other. For example, the boosted high level at BT1 may be different from the boosted high level at BT2, and the boosted high clock level at CK1 may be different from the boosted high clock level at CK2.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A boost circuit comprising:
    a power rail to provide a supply voltage;
    a switch transistor controlling an output of a boosted signal and having a gate; and
    a timing and voltage control circuit configured to generate an equalization (EQ) signal to be applied to the gate of the switch transistor, the EQ signal having a level being one of an EQ high level, an EQ low level lower than the EQ high level, and an EQ clamped level between the EQ low level and the EQ high level.

2. The boost circuit of claim 1,
    wherein the boosted signal has a level being a boosted high level during a first time period or a low level during a second time period,
    wherein the timing and voltage control circuit comprises:
        a first circuit branch connected between the power rail and an output terminal coupled to the gate of the switch transistor, the first circuit branch being configured to generate the EQ high level to the output terminal during a third time period;
        a second circuit branch connected between the power rail and the output terminal, the second circuit branch being configured to generate the EQ clamped level to the output terminal during a fourth time period; and
        a third circuit branch connected between a ground and the output terminal, the third circuit branch being configured to generate the EQ low level to the output terminal during a fifth time period,
    wherein the switch transistor turns off when the EQ signal is at the EQ high level and turns on when the EQ signal is at the EQ low level or the EQ clamped level, and
    wherein the fourth time period encompasses the first time period.

3. The boost circuit of claim 2, wherein:
    the first circuit branch comprises a transistor configured to be turned on during the third time period to allow the output terminal to be electrically coupled to the power rail, and
    the EQ high level approximately equals the supply voltage.

4. The boost circuit of claim 2, wherein:
    the second circuit branch comprises:
        a transistor configured to be turned on during the fourth time period; and
        a voltage clamping element electrically coupled to the transistor, the voltage clamping element being configured to clamp a voltage output from the output terminal to the EQ clamped level, and the EQ clamped level is lower than the supply voltage.

5. The boost circuit of claim 4, wherein:
the transistor is a first transistor, and
the voltage clamping element includes a second transistor controlled by a reference voltage such that the second transistor is partially turned on and a voltage drop across the second transistor is high enough to allow the voltage output from the output terminal to be clamped at the EQ clamped level.

6. The boost circuit of claim 4, wherein:
the transistor is a first transistor, and
the voltage clamping element includes a second transistor coupled to a diode.

7. The boost circuit of claim 1, wherein the timing and voltage control circuit is further configured to generate:
a boost source signal to be boosted to generate the boosted signal, and
an EQ input signal used for generating the EQ signal.

8. The boost circuit of claim 7, wherein the timing and voltage control circuit further comprises:
a time delay element, configured to generate a delayed signal by delaying an input signal;
a logic circuit, configured to generate the boost source signal and the EQ input signal according to the input signal and the delayed signal.

9. The boost circuit of claim 7, further comprising:
a capacitor coupling the boost source signal to the switch transistor.

10. The boost circuit of claim 1, further comprising:
a charge path electrically coupled between the power rail and the switch transistor; and
a discharge path electrically coupled between the switch transistor and a ground.

11. The boost circuit of claim 10, wherein the discharge path comprises:
a discharge transistor electrically coupled to the ground, the discharge transistor being configured to be turned on to pull the boosted signal to a low level; and
a low-threshold transistor electrically coupled between the discharge transistor and the switch transistor, a gate of the low-threshold transistor being electrically coupled to the power rail.

12. The boost circuit of claim 1, wherein:
the boosted signal is a first boosted signal having a level being a first boosted high level during a first time period or a first low level during a second time period, the first boosted high level being higher than a breakdown voltage of the switch transistor, and
the switch transistor is further configured to control output of a second boosted signal from the source of the switch transistor, the second boosted signal having a level being a second boosted high level during a third time period or a second low level during a fourth time period, the second boosted high level being lower than the breakdown voltage of the switch transistor.

13. The boost circuit of claim 12, wherein:
the EQ signal is a first EQ signal, the EQ high level is a first EQ high level and the EQ low level is a first EQ low level, and
the timing and voltage control circuit is further configured to generate a second EQ signal having a level being a second EQ high level during a fifth time period or a second EQ low level during a sixth time period.

14. The boost circuit of claim 13, wherein:
the timing and voltage control circuit comprises:
a first circuit branch connected between the power rail and an output terminal coupled to the gate of the switch transistor, the first circuit branch being configured to generate the second EQ high level to the output terminal during the fifth time period,
a second circuit branch connected between the power rail and the output terminal, the second circuit branch being configured to be electrically isolated from the power rail during the fifth time period and the sixth time period, and
a third circuit branch connected between a ground and the output terminal, the third circuit branch being configured to generate the second EQ low level to the output terminal during the sixth time period;
the switch transistor turns off when the second EQ signal is at the second EQ high level and turns on when the second EQ signal is at the second EQ low level; and
the fifth time period encompasses the fourth time period.

15. The boost circuit of claim 14, wherein the second circuit branch comprises a power-controlled transistor configured to be turned off during the fifth time period and the sixth time period.

16. A method for controlling output of a boosted signal, comprising:
generating an equalization (EQ) signal having a level being one of an EQ high level, an EQ low level lower than the EQ high level, and an EQ clamped level between the EQ low level and the EQ high level; and
applying the EQ signal to a gate of a switch transistor controlling an output of the boosted signal.

17. The method of claim 16, wherein:
the boosted signal includes a level being a boosted high level during a first time period or a low level during a second time period,
generating the EQ signal includes:
generating the EQ high level during a third time period,
generating the EQ clamped level during a fourth time period, and
generating the EQ low level during a fifth time period,
wherein applying the EQ signal to the gate of the switch transistor includes:
applying the EQ high level during the third time period to the gate of the switch transistor to turn off the switch transistor,
applying the EQ clamped level during the fourth time period to the gate of the switch transistor to turn on the switch transistor, and
applying the EQ low level during the fifth time period to the gate of the switch transistor to turn on the switch transistor, and
the fourth time period encompasses the first time period.

18. The method of claim 17, wherein generating the EQ high level includes generating the EQ high level that equals a supply voltage.

19. The method of claim 16, further comprising:
generating a boost source signal to be boosted to generate the boosted signal; and
generating an EQ input signal used for generating the EQ signal.

* * * * *